United States Patent
Iwata

(10) Patent No.: US 8,917,015 B2
(45) Date of Patent: Dec. 23, 2014

(54) ORGANIC ELECTROLUMINESCENCE DEVICE AND ELECTRONIC APPARATUS

(71) Applicant: Seiko Epson Corporation, Tokyo (JP)

(72) Inventor: Shinichi Iwata, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/103,051

(22) Filed: Dec. 11, 2013

(65) Prior Publication Data

US 2014/0167604 A1    Jun. 19, 2014

(30) Foreign Application Priority Data

Dec. 17, 2012   (JP) ................................. 2012-274431

(51) Int. Cl.
　　*H01J 1/62*　　(2006.01)
　　*H01J 63/04*　　(2006.01)
　　*H05B 33/22*　　(2006.01)

(52) U.S. Cl.
　　CPC ..................................... *H05B 33/22* (2013.01)
　　USPC ............................. 313/504; 313/506; 313/512

(58) Field of Classification Search
　　USPC .......................................... 313/504, 506, 512
　　See application file for complete search history.

(56) References Cited

U.S. PATENT DOCUMENTS

| | | | | |
|---|---|---|---|---|
| 5,554,911 A * | 9/1996 | Nakayama et al. | ............ | 313/504 |
| 5,847,506 A | 12/1998 | Nakayama et al. | | |
| 6,639,250 B1 * | 10/2003 | Shimoda et al. | ................. | 257/98 |
| 7,126,269 B2 * | 10/2006 | Yamada | ......................... | 313/504 |
| 7,470,933 B2 * | 12/2008 | Lee et al. | ........................... | 257/79 |
| 7,517,550 B2 * | 4/2009 | Huang et al. | ..................... | 427/66 |
| 7,548,019 B2 * | 6/2009 | Omura et al. | .................. | 313/506 |
| 7,615,790 B2 * | 11/2009 | Lee | .................. | 257/79 |
| 7,741,770 B2 * | 6/2010 | Cok et al. | ....................... | 313/498 |
| 7,855,508 B2 * | 12/2010 | Cok et al. | ....................... | 313/506 |
| 7,868,528 B2 * | 1/2011 | Kobayashi | ..................... | 313/112 |
| 7,872,256 B2 * | 1/2011 | Sung et al. | ...................... | 257/40 |
| 7,973,319 B2 * | 7/2011 | Kashiwabara et al. | .......... | 257/79 |
| 7,994,704 B2 * | 8/2011 | Kobayashi | ..................... | 313/503 |
| 8,022,620 B2 * | 9/2011 | Kobayashi | ..................... | 313/506 |
| 8,040,052 B2 * | 10/2011 | Kobayashi | ..................... | 313/506 |
| 8,063,552 B2 * | 11/2011 | Cok et al. | ....................... | 313/503 |
| 8,207,668 B2 * | 6/2012 | Cok et al. | ....................... | 313/506 |
| 8,237,360 B2 * | 8/2012 | Kinoshita | ...................... | 313/506 |
| 8,253,127 B2 * | 8/2012 | Kang et al. | ...................... | 257/40 |
| 8,319,231 B2 * | 11/2012 | Kajimoto | ......................... | 257/88 |
| 8,344,619 B2 * | 1/2013 | Song | ............................ | 313/506 |
| 8,358,060 B2 * | 1/2013 | Song et al. | ..................... | 313/504 |

(Continued)

FOREIGN PATENT DOCUMENTS

JP   A-8-213174    8/1996
JP   A-8-241048    9/1996

(Continued)

*Primary Examiner* — Thomas A Hollweg

(74) *Attorney, Agent, or Firm* — Oliff PLC

(57) ABSTRACT

An organic EL device includes a substrate, a first colored layer, a first luminescence element having a first pixel electrode, a reflection layer, and an insulation layer which overlaps a second portion without overlapping a first portion of a first pixel electrode. Light emitted from the first luminescence element includes a first light emitted from a region overlapping a first portion and a second light emitted from a region overlapping a second portion, and a film thickness of an insulation layer or optical characteristics of the first colored layer are set so that the first light is transmitted through the first colored layer more than the second light is.

12 Claims, 13 Drawing Sheets

(56) References Cited

U.S. PATENT DOCUMENTS

| | | | |
|---|---|---|---|
| 8,410,683 B2* | 4/2013 | Song et al. | 313/504 |
| 8,427,047 B2* | 4/2013 | Choi et al. | 313/504 |
| 8,461,577 B2* | 6/2013 | Sumita et al. | 257/40 |
| 8,471,275 B2* | 6/2013 | Lee et al. | 257/89 |
| 8,513,882 B2* | 8/2013 | Kinoshita | 313/506 |
| 8,581,275 B2* | 11/2013 | Omoto | 257/91 |
| 8,691,603 B2* | 4/2014 | Uchida | 438/29 |
| 2005/0040756 A1* | 2/2005 | Winters et al. | 313/504 |
| 2005/0225232 A1* | 10/2005 | Boroson et al. | 313/504 |
| 2005/0249972 A1* | 11/2005 | Hatwar et al. | 428/690 |
| 2005/0280364 A1* | 12/2005 | Omura et al. | 313/506 |
| 2006/0291188 A1* | 12/2006 | Nakayama et al. | 362/84 |
| 2007/0057264 A1* | 3/2007 | Matsuda | 257/88 |
| 2007/0063645 A1* | 3/2007 | Yokoyama | 313/506 |
| 2007/0159085 A1* | 7/2007 | Kuma et al. | 313/506 |
| 2007/0159086 A1* | 7/2007 | Yu et al. | 313/506 |
| 2007/0216289 A1* | 9/2007 | Kuma et al. | 313/504 |
| 2007/0236135 A1* | 10/2007 | Fukuda et al. | 313/503 |
| 2007/0296334 A1* | 12/2007 | Matsuda | 313/506 |
| 2008/0018239 A1* | 1/2008 | Matsuda et al. | 313/504 |
| 2008/0042146 A1* | 2/2008 | Cok et al. | 257/79 |
| 2008/0042552 A1* | 2/2008 | Cok | 313/501 |
| 2008/0067926 A1* | 3/2008 | Mizuno et al. | 313/504 |
| 2008/0303419 A1* | 12/2008 | Fukuda | 313/504 |
| 2009/0103304 A1 | 4/2009 | Kobayashi | |
| 2012/0299033 A1* | 11/2012 | Goda | 257/89 |
| 2014/0027792 A1* | 1/2014 | Iwasaki et al. | 257/88 |

FOREIGN PATENT DOCUMENTS

| | | |
|---|---|---|
| JP | A-2008-16205 | 1/2008 |
| JP | A-2009-117343 | 5/2009 |
| JP | A-2012-195063 | 10/2012 |
| JP | A-2013-20744 | 1/2013 |

* cited by examiner

SPECTRAL CHARACTERISTICS OF BLUE LUMINESCENCE ELEMENT

TRANSMISSION CHARACTERISTICS OF BLUE COLORED LAYER

SPECTRAL CHARACTERISTICS OF RED LUMINESCENCE ELEMENT

TRANSMISSION CHARACTERISTICS OF RED COLORED LAYER

ORGANIC ELECTROLUMINESCENCE DEVICE AND ELECTRONIC APPARATUS

BACKGROUND

1. Technical Field

The present invention relates to an organic electroluminescence (EL) device and an electronic apparatus including the organic EL device.

2. Related Art

An EL device of active matrix type which includes an EL element interposing an organic electroluminescence layer between a cathode and an anode and a transistor and a capacitor for controlling the drive of the EL element has been known. In the EL device, in order to electrically insulate anodes adjacent to each other, there is provided a passivation layer which has an opening on the anode and where the bottom end of the opening extends on the anode (JP-A-08-241048).

In addition, an organic luminescence element has been known which stacks a semi-transparent reflective layer, a transparent conductive layer, a luminescence layer formed of an organic thin film, and a back electrode on a transparent substrate, and in which an optical resonator is provided between the semi-transparent reflection layer and the back electrode. The organic luminescence element has a narrow half width of a luminescence spectrum, so that it is possible to improve luminescence characteristics (JP-A-08-213174).

In the EL element of JP-A-08-241048, in not only the opening portion on the anode, but also a region of the anode covered with the passivation layer (insulation layer), it is known that a hole injected from the anode side and an electron injected from the cathode side are combined on the luminescence layer and light is emitted from the luminescence layer. When an optical resonator structure of JP-A-08-213174 in the EL element of JP-A-08-241048 is provided, an optical distance of the center portion of a pixel electrode (anode) in the optical resonator is different from an optical distance of the peripheral portion (a region where the anode overlaps with the passivation layer) of the pixel electrode. Therefore, a peak wavelength of luminescence obtained by the optical resonator becomes different in the center portion of the pixel electrode (anode) and the peripheral portion. Particularly, the peak wavelength of luminescence obtained from the peripheral portion has the optical distance greater than that in the center portion, so that the peak wavelength of luminescence shifts to a wavelength side longer than an originally intended peak wavelength. When a color filter transmits light shifted to the long wavelength side and light of the originally intended peak wavelength, even if the color filter is provided with respect to an EL element, there is a problem that light mixture where light of different colors is mixed occurs and makes it impossible to perform a display in a desired color.

SUMMARY

The invention can be realized in the following forms or application examples.

Application Example 1

According to this application example, there is provided an organic electroluminescence device, including a substrate, a first colored layer disposed on a first surface of the substrate, a first luminescence element which is disposed between the first surface of the substrate and the first colored layer and has a stack structure where a first pixel electrode, a functional layer having a luminescence layer, and an opposite electrode are stacked, a first reflection layer which is disposed between the first surface and the first pixel electrode and forms a first resonator structure between the first reflection layer and the opposite electrode, and an insulation layer which is disposed between the first surface and the functional layer through the first pixel electrode, and in which the first pixel electrode includes a first portion which does not overlap the insulation layer and a second portion which overlaps the insulation layer in a plan view, light emitted from the first luminescence element including a first light, which is emitted from a portion which overlaps the first portion of the functional layer and has a first peat wavelength, and a second light, which is emitted from a portion which overlaps the second portion of the functional layer and has a second peak wavelength, and a film thickness of the insulation layer or optical characteristics of the first colored layer are set so that the first light is transmitted through the first colored layer more than the second light is.

In addition, according to this application example, there is provided an organic electroluminescence device, including a substrate, a first colored layer which is disposed on a first surface of the substrate, a first luminescence element which is disposed between the first surface of the substrate and the first colored layer and includes a stack structure in which a first pixel electrode, a functional layer having a luminescence layer, and an opposite electrode are stacked, a first reflection layer which is disposed between the first surface and the first pixel electrode and forms a first resonator structure between the first reflection layer and the opposite electrode, and an insulation layer which is disposed between the first surface and the functional layer through the first pixel electrode, and in which the first pixel electrode has a first portion which does not overlap the insulation layer, and a second portion which overlaps the insulation layer in a plan view, light emitted from the first luminescence element includes a first light, which is emitted from a portion overlapping the first portion of the functional layer and has a first peak wavelength, and a second light, which is emitted from a portion overlapping the second portion of the functional layer and has a second peak wavelength and a film thickness of the insulation layer or optical characteristics of the first colored layer is set so that transmittance of light of the first colored layer in the first peak wavelength is higher than transmittance of light of the first colored layer in the second peak wavelength.

In these cases, among light beams which are emitted from the functional layer of the first luminescence element, enhanced using the first resonator structure and is transmitted through a first colored layer, the second light, which is emitted from a portion overlapping the second portion and has the second peak wavelength, is absorbed into the first colored layer more than the first light, which is emitted from a portion overlapping the second portion and has the second peak wavelength.

Therefore, compared to an organic electroluminescence device which does not include a configuration of the application example, it is possible to prevent light, which is shifted to a wavelength longer than the first peak wavelength, which is an intended peak wavelength, and has the second peak wavelength, from being mixed into luminescence from the first luminescence element. Accordingly, it is possible to provide an organic electroluminescence device which has less color deviation and has an excellent display quality.

Application Example 2

In the organic electroluminescence device according to the application example, it is preferable that transmittance of the second light in the first colored layer be equal to or less than 15%.

In this case, it is possible to provide an organic electroluminescence device which has less color deviation and an excellent display quality.

Application Example 3

In the organic electroluminescence device according to the application example, it is preferable that a film thickness of the insulation layer be set so that transmittance of the second light in the first colored layer is equal to or less than 15%.

In this case, it is possible to adjust a difference between a first peak wavelength of the first light, which is enhanced by the first resonator structure in a portion overlapping the first portion of a functional layer, and the second peak wavelength of the second light, which is enhanced by the first resonator structure in a portion overlapping the second portion of the functional layer, using a film thickness of an insulation layer. Accordingly, it is possible to provide an organic electroluminescence device which can be manufactured in a simpler manufacturing process and has an excellent display quality.

Application Example 4

In the organic electroluminescence device according to the application example, it is preferable to further include a second colored layer which is disposed on the same layer as the first colored layer and has different transmission characteristics of light from the first colored layer; a second luminescence element which is disposed between the first surface and the second colored layer and has a stack structure in which a second pixel electrode, the functional layer, and the opposite electrode are stacked; and a second reflection layer which is disposed between the first surface and the second pixel electrode and forms a second resonator structure between the second reflection layer and the opposite electrode, and it is preferable that the second pixel electrode include a third portion which does not overlap the insulation layer and a fourth portion which overlaps the insulation layer, that light emitted from the second luminescence element include a third light, which is emitted from a portion overlapping the third portion of the functional layer and has a third peak wavelength, and a fourth light which is emitted from a portion overlapping the fourth portion of the functional layer and has a fourth peak wavelength, that the second colored layer absorb the fourth light more than the third light, and that the film thickness of the insulation layer overlapping the second portion be different from the film thickness of the insulation layer overlapping the fourth portion.

In this case, among light beams which are emitted from the functional layer of a second luminescence element, enhanced using the second resonator structure, and transmitted through the second colored layer, the fourth light which is emitted from a portion overlapping the fourth portion of the functional layer and has the fourth peak wavelength is absorbed into the second colored layer more than the third light which is emitted from a portion overlapping the third portion of the functional layer and has the third peak wavelength.

Therefore, compared to an organic electroluminescence device which does not include a configuration of the application example, it is possible to prevent light having the fourth peak wavelength, which is shifted to a wavelength longer than the third peak wavelength which is an intended peak wavelength, from being mixed into luminescence from a second luminescence element.

Further, in this case, since the film thickness of the insulation layer is different between a portion overlapping the second portion and a portion overlapping the fourth portion, it is possible to set the film thickness of the insulation layer according to transmission characteristics of respective light of the first colored layer and of the second colored layer, and to provide an organic EL device which has less color deviation and an excellent display quality.

Application Example 5

In the organic electroluminescence device according to the application example, it is preferable to further include a third colored layer which is disposed on the same layer as the first colored layer and has different transmission characteristics of light from the first colored layer; a third luminescence element which is disposed between the first surface and the third colored layer and has a stack structure in which a third pixel electrode, the functional layer, and the opposite electrode are stacked; and a third reflection layer which is disposed between the first surface and the third pixel electrode and forms a third resonator structure between the third reflection layer and the opposite electrode, and it is preferable that the third pixel electrode include a fifth portion which does not overlap the insulation layer and a sixth portion which overlaps the insulation layer, that light emitted from the third luminescence element include a fifth light, which is emitted from a portion overlapping the fifth portion of the functional layer and has a fifth peak wavelength, and a sixth light, which is emitted from a portion overlapping the sixth portion of the functional layer and has a sixth peak wavelength, and the third colored layer transmits 15% or more of the fifth light and the sixth light.

In this case, among light beams emitted from the functional layer of the third luminescence element and enhanced using the third resonator structure, and transmitted through a third colored layer, both the fifth light, which is emitted from a portion overlapping the fifth portion of the functional layer and has the fifth peak wavelength, and the sixth light, which is emitted from a portion overlapping the sixth portion of the functional layer and has the sixth peak wavelength, is transmitted through 15% or more of the third colored layer. In other words, a film thickness of the insulation layer overlapping the sixth portion is not a film thickness so that the sixth peak wavelength shifts to a range where transmittance of the third colored layer is 20% or less.

Therefore, it is possible to make the film thickness of the insulation layer of the portion overlapping the sixth portion the same as a film thickness of the insulation layer of a portion overlapping the second portion or a portion overlapping the fourth portion, and compared to a case where film thicknesses of the insulation layer of a portion overlapping the second portion, the fourth portion, and the sixth portion are different from each other, it is possible to manufacture the organic electroluminescence (EL) device in a more convenient process.

Application Example 6

According to this application example, there is provided an electronic apparatus, including the organic electroluminescence device described in any of the application examples.

In this case, because of the organic electroluminescence device described in any of the application examples, it is possible to provide an electronic apparatus which has less color deviation and an excellent display quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to drawings. In each diagram below, in order to make each layer and each member a recognizable size, a scale of each layer and each member is different from the actual measurements.

First Embodiment

Organic Electroluminescence Device

Figure 1:
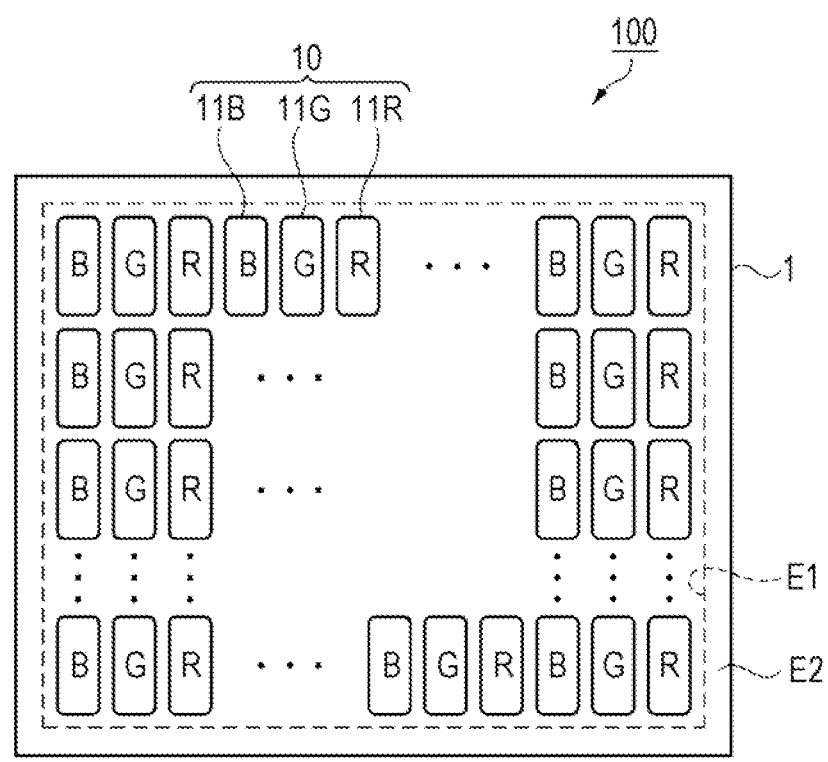
FIG. 1 is a schematic plan view showing a basic configuration of an organic electroluminescence device according to a first embodiment.

FIG. 1 is a schematic plan view showing a basic configuration of an organic electroluminescence device according to an embodiment 1.

First, a schematic configuration of an organic electroluminescence (EL) device 100 according to the embodiment 1 will be described.

As shown in FIG. 1, the organic EL device 100 of the embodiment includes a substrate 1, and a plurality of pixels 10 disposed in a display region E1 on a first surface of the substrate 1. In a non-display region E2 between the display region E1 and a peripheral edge of the substrate 1, a peripheral circuit for causing a pixel 10 to emit light is provided. An example of the peripheral circuit includes a scanning line drive circuit, a data line drive circuit, a test circuit, and the like.

The plurality of pixels 10 is disposed in a matrix shape in the display region E1, and configured to have a plurality of sub-pixels 11 which emit light of different wavelengths, for example, a blue (B) sub-pixel 11B, a green (G) sub-pixel 11G, and a red (R) sub-pixel 11R. Later, it is described that a direction where the sub-pixels 11 in different colors are arranged is set to an X direction and a direction where the sub-pixels 11 in the same color are arranged is set to a Y direction. An arrangement of the sub-pixels 11 in different colors is not limited thereto.

Figure 2:
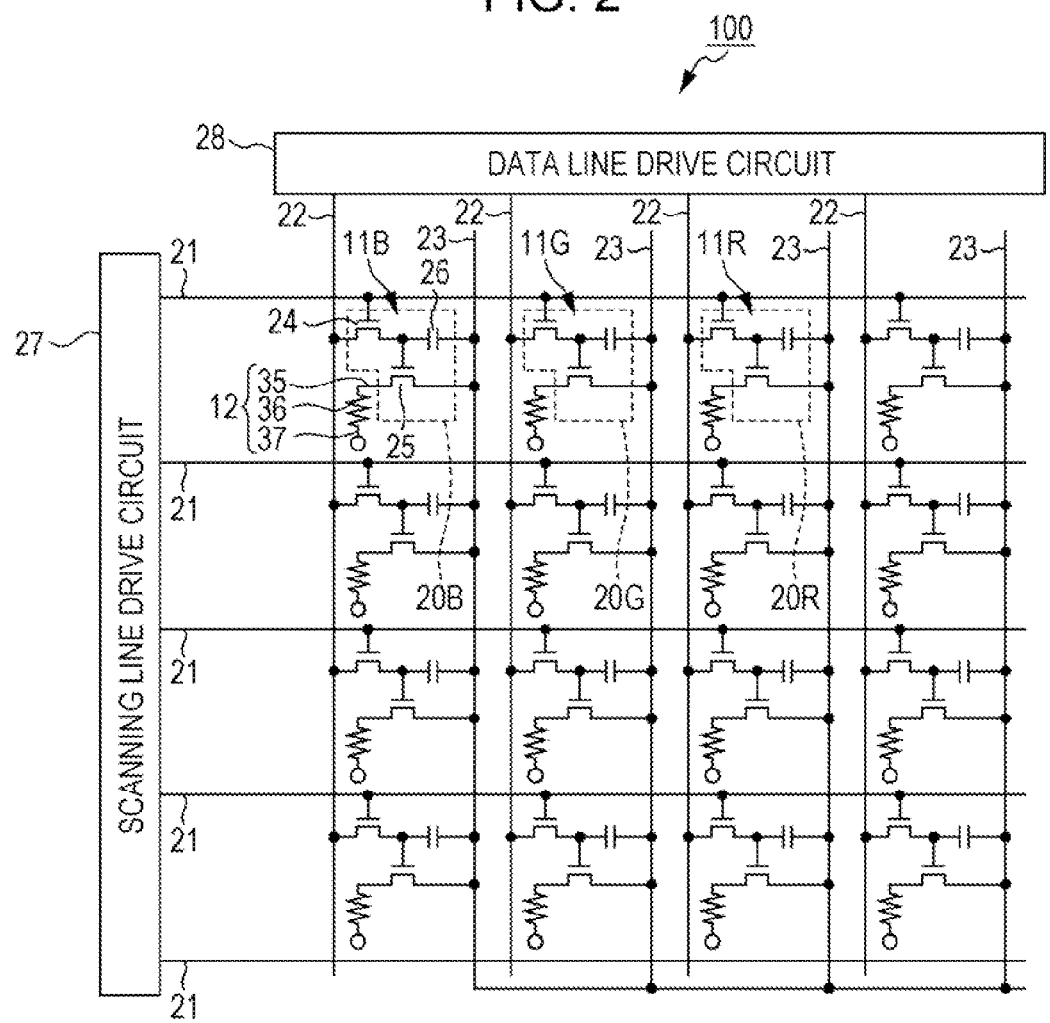
FIG. 2 is an equivalent circuit view showing an electric configuration in the organic electroluminescence device according to the first embodiment.

FIG. 2 is an equivalent circuit view showing an electric configuration in the organic electroluminescence device according to the embodiment 1.

As shown in FIG. 2, the organic EL device 100 in the embodiment includes a plurality of scanning lines 21, a plurality of data lines 22 extending in a direction intersecting with the scanning line 21, and a plurality of power lines 23 extending in parallel to the data line 22. The plurality of scanning lines 21 are connected to a scanning line drive circuit 27, and a plurality of data lines 22 are connected to a data line drive circuit 28. A power line 23 in the embodiment is a power line for an anode for applying a potential to a pixel electrode 35 as an anode.

According to the intersection of the scanning line 21 with the data line 22, the sub-pixels 11 (11R, 11G, 11B) are provided. Each of the plurality of sub-pixels 11 includes a luminescence element 12 and a pixel circuit 20 (20B, 20G, and 20R) for controlling a drive of the luminescence element 12.

The luminescence element 12 is an organic electroluminescence (EL) element which includes the pixel electrode 35 functioning as an anode, an opposite electrode 37 functioning as a cathode, and a functional layer 36 having an organic luminescence layer disposed between the pixel electrode 35 and the opposite electrode 31.

The pixel circuit 20 (20B, 20G and 20R) includes a switching transistor 24, a drive transistor 25, and a holding capacitor 26 connected to a gate electrode of the drive transistor 25, and controls a drive of the luminescence element 12. Here, the control of a drive of the luminescence element 12 is to cause the luminescence element 12 to emit light in a luminescence period based on a data signal supplied through a data line 22 in a writing period. A scanning signal is supplied to a gate electrode of a switching transistor 24 through the scanning line 21, and when the switching transistor 24 is in an ON state, a data signal supplied from the data line 22 connected to any one of a source and a drain of the switching transistor 24 is held in the holding capacitor 26.

When the drive transistor 25 is in an ON state, the pixel electrodes 35 of the luminescence element 12 and the power line 23 are electrically connected to each other through the drive transistor 25, and a current amount corresponding to the potential of the data signal held in the holding capacitor 26 is supplied to the luminescence element 12. The luminescence element 12 emits light at a brightness corresponding to the supplied current amount.

Figure 3A:
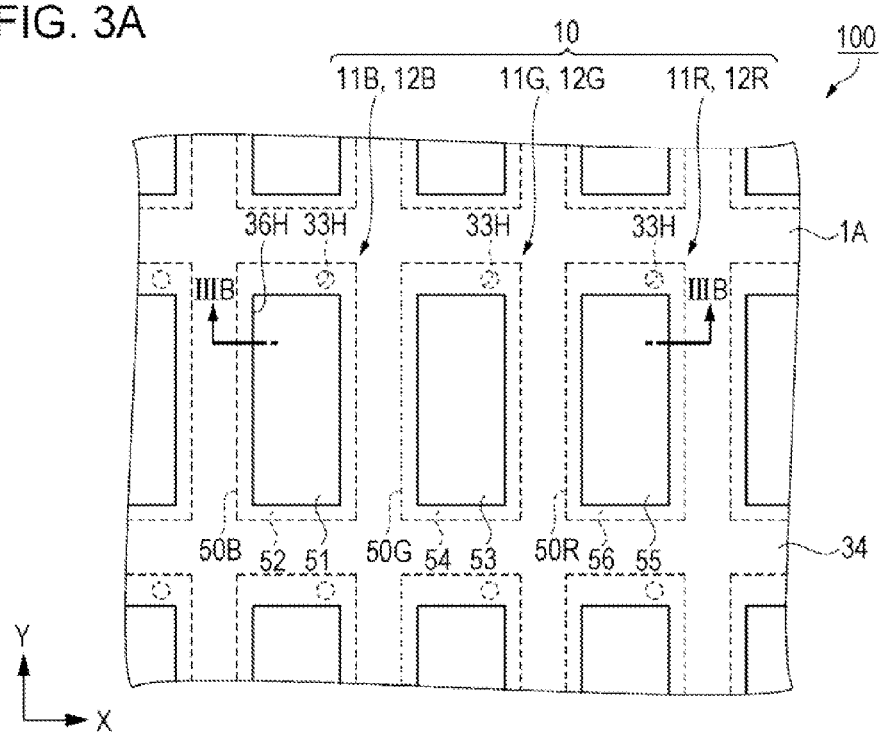
FIGS. 3A and 3B are a plan view and a cross-sectional view of a luminescence element in the organic electroluminescence device according to the first embodiment.
Figure 3B:
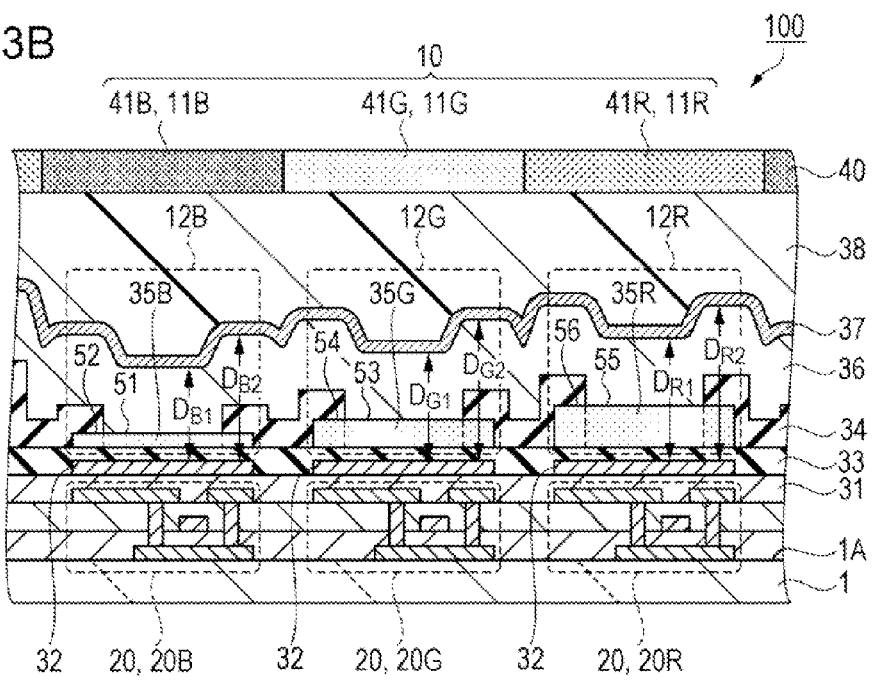

FIGS. 3A and 3B are a plan view and a cross-sectional view of a luminescence element in the organic electroluminescence device according to the embodiment 1. More specifically, FIG. 3A shows a planar disposition of the sub-pixels 11, and FIG. 3B is a cross-sectional view taken along a line IIIB-IIIB of FIG. 3A.

As shown in FIG. 3A, each of the sub-pixels 11 (11B, 11G, and 11R) configuring the pixel 10 is formed to have a shape (rectangular shape) which has a longer length in a second direction (Y direction in FIG. 3A) along a first surface 1A and intersecting with a first direction than a length in a first direction (X direction in FIG. 3A) along the first surface 1A of the substrate 1.

Then, the blue sub-pixel 11B, the green sub-pixel 11G, and the red sub-pixel 11R are disposed along the X direction, and a luminescence element 12B as a first luminescence element is disposed in the blue sub-pixel 11B. In the green sub-pixel 11G, a luminescence element 12G as a second luminescence element is disposed. In the red sub-pixel 11R, a luminescence element 12R as a third luminescence element is disposed.

As shown in FIG. 3B, the organic EL device 100 in the embodiment is configured to have the substrate 1, a pixel circuit 20 (20B, 20G, and 20R) formed on the first surface 1A of the substrate 1, a planarization layer 31 formed on the pixel circuit 20 (20B, 20G, and 20R), a reflection layer 32 disposed on the planarization layer 31, the pixel electrode 35 disposed on the reflection layer 32 through an interlayer insulation layer 33, an insulation layer 34 formed to cover a portion of the interlayer insulation layer 33 and the pixel electrode 35, the functional layer 36 having an organic luminescence layer formed on the pixel electrode 33 (35B, 35G, and 35R), and the opposite electrode 37 formed on the functional layer 36.

A luminescence element 12B as the first luminescence element is configured to have a pixel electrode 35B as the first pixel electrode, the functional layer 36, and the opposite electrode 37, and the luminescence element 12G as the second luminescence element is configured to have a pixel electrode 35G as the second pixel electrode, the functional layer 36, and the opposite electrode 37. In the same manner, a luminescence element 12R as a third luminescence element is configured to have a pixel electrode 35B as the third pixel electrode, the functional layer 36, and the opposite electrode 37.

The organic EL device 100 in the embodiment adopts a top emission method by which light is extracted from an opposite electrode 37 side. Therefore, the substrate 1 may be a transparent substrate made of a resin material and a material such as quartz glass and soda glass, and may foe a non-transparent substrate made of a ceramic material and a metal material.

The pixel circuit 20, as shown in FIG. 2, includes the switching transistor 24, the drive transistor 25, the holding capacitor 26 connected to a gate electrode of the drive transistor 25, and controls a drive of the luminescence element 12. The switching transistor 24 and the drive transistor 25 include a semiconductor region where a source region, a drain region and a channel region are formed, and a gate electrode which is formed to oppose the channel region. In addition, these transistors configuring the pixel circuit 20 may be a thin film transistor, and may be a field effect transistor (for example, MOS transistor) which is formed on a semiconductor substrate such as a bulk silicon substrate and the like.

On a layer between the first surface 1A of the display region E1 and the luminescence element 12, the scanning line 21 which supplies a scanning signal to the gate electrode of the switching transistor 24, the data line 22 which supplies a data signal held in the holding capacitor 26, the power line 23 which supplies a current supplied to the luminescence element 12, and the like are disposed. FIG. 3B shows only some of elements that configure the pixel circuit 20.

The reflection layer 32 is disposed on the pixel circuit 20 through the planarization layer 31 made of a material having an insulation property such as silicon oxide, silicon nitride, silicon oxynitride, and the like. The reflection layer 32 reflects to the organic luminescence layer side light emitted from the organic luminescence layer to the reflection layer 32 side. In addition, the reflection layer 32 forms a resonator structure between the reflection layer 32 and the opposite electrode 37. As material used in the reflection layer 32, A1 and the alloy thereof, Ag and the alloy thereof, and the like are used.

In the embodiment, the reflection layer 32 is independently provided in each of the sub-pixels 11B, 11G, and 11R to correspond to a first reflection layer, a second reflection layer, and a third reflection layer in the invention. However, the reflection layer 32 is not limited thereto, and may be formed across the plurality of sub-pixels 11B, 11G, and 11R. In this case, it is necessary to electrically insulate the reflection layer 32 and each pixel circuit 20B, 20G, and 20R. An opening may be provided in a region where each pixel circuit 20B, 20G, and 20R overlaps the reflection layer 32, and the pixel electrodes 35B, 35G, and 35R of the sub-pixels 11B, 11G, and 11R may be connected to the pixel circuits 20B, 20G, and 20R, respectively, through the opening.

The interlayer insulation layer 33 made of silicon oxide, silicon nitride, or silicon oxynitride is disposed on the reflection layer 32. A contact hole 33H (refer to FIG. 3A) for connecting the pixel electrode 35 and the pixel circuit 20 is provided on the interlayer insulation layer 33, and using a connection portion disposed in the contact hole 33H, the pixel electrode 35 and the pixel circuit 20 are electrically connected to each other.

The contact hole 33H is preferably provided at a position where a connection portion is a corner of the pixel electrode 35. In addition, in the embodiment, the contact hole 33H is provided near the corner of the same side in each sub-pixel 11B, 11G, and 11R as shown in FIG. 3A.

The pixel electrodes 35B, 35G, and 35R are disposed on the interlayer insulation layer 33. The pixel electrodes 35B, 35G, and 35R in the embodiment function as an anode, and a transparent electrode made of indium tin oxide (ITO), indium zinc oxide (IZO) and the like. In addition, in the embodiment, by causing the film thickness of the pixel electrodes 35B, 35G, and 35R to be different for sub-pixels 11B, 11G, and 11R, an optical path length of the resonator structure is adjusted.

A film thickness of the pixel electrode 35B disposed in the blue sub-pixel 11B is set so that an optical resonator of the blue sub-pixel 11B enhances blue light, and a film thickness of the pixel electrode 35G disposed in the green sub-pixel 11G is set so that an optical resonator of the green sub-pixel 11G enhances green light. A film thickness of the pixel electrode 35R disposed in the red sub-pixel 11R is set so that an optical resonator of the red sub-pixel 11R enhances red light. A film thickness of each layer other than the pixel electrodes 35B, 35G, and 35R is the same in all sub-pixels 11. Although the film thicknesses are the same, the film thicknesses include errors occurring during manufacturing.

In the embodiment, blue light refers to light of wavelength equal to or greater than 400 nm and less than 500 nm, light of green refers to light of wavelength equal to or more than 500 nm and less than 600 nm, and red light refers to light of wavelength equal to or more than 600 nm and less than 700 nm.

In the embodiment, each sub-pixel 11B, 11G, and 11R includes the optical resonator (a first resonator, a second resonator, and a third resonator), thereby obtaining light having a resonance wavelength (peak wavelength) where luminescence brightness is enhanced in the wavelength range of each of blue, red, and green.

An adjustment of an optical distance between the reflection layer 32 and the opposite electrode 37 for causing light resonance to occur in each optical resonator (the first resonator, the second resonator, and the third resonator) is not limited to a method of causing the film thicknesses of the pixel electrodes 35B, 35G, and 35R to be different from each other. For example, by making the film thicknesses of the pixel electrodes 35B, 35G, and 35R all the same and causing the film thicknesses of the interlayer insulation layer 33 between the reflection layer 32 and the pixel electrodes 35B, 35G, ad 35R to be different for each of the sub-pixels 11B, 11G, and 11R, the optical distance of the optical resonator (the first resonator, the second resonator, and the third resonator) may be adjusted.

The pixel electrodes 35B, 35G, and 35R each have a portion which does not overlap the insulation layer 34 and a portion which overlaps the insulation layer 34, in a plan view. The pixel electrode 35B has a first portion 51, which does not overlap the insulation layer 34, and a second portion 52, which overlaps the insulation layer 34, and the pixel electrode 35G has a third portion 53, which does not overlap the insulation layer 34, and a fourth portion 54, which overlaps the insulation layer 34. The pixel electrode 35R has a fifth portion 55 which does not overlap the insulation layer 34 and a sixth portion 56 which overlaps the insulation layer 34. The plan view in the specification is a view from a normal direction (third direction) of the first surface 1A of the substrate 1.

As shown in FIGS. 3A and 3B, the first portion 51 is positioned at the center portion of the pixel electrode 35B, and the second portion 52 is positioned in a region along the peripheral edge 50B of the pixel electrode 35B so as to surround the first portion 51. The third portion 53 is positioned at the center portion of the pixel electrode 35G, and the fourth portion 54 is positioned in a region along the peripheral edge 50G of the pixel electrode 35G so as to surround the third portion 53. The fifth portion 55 is positioned at the center portion of the pixel electrode 35R, and the sixth portion 56 is positioned in a region along the peripheral edge 50R of the pixel electrode 35R so as to surround the fifth portion 55.

The first portion 51 and the second portion 52 overlap the reflection layer 32 disposed in the blue sub-pixel 11B in a plan view, the third portion 53 and the fourth portion 54 overlap the reflection layer 32 disposed in the green sub-pixel 11G in a plan view, and the fifth portion 55 and the sixth portion 56 overlap the reflection layer 32 disposed in the red sub-pixel 11R in a plan view.

On the first surface 1A of the substrate 1, the insulation layer 34 covering the peripheral edge 50B, 50G, and 50R of each pixel electrode 35B, 35G, and 35R is disposed. In addition, the insulation layer 34 is disposed in a region overlapping the contact hole 33H in a plan view. An opening 36H to expose the most (center portion) of the pixel electrode 35 is provided on the insulation layer 34, and the pixel electrode 35 and the functional layer 36 are connected to each other through the opening 36H. The insulation layer 34 where the opening 36H is provided is made of a material having an insulation property such as silicon oxide, silicon nitride, silicon oxynitride, and the like. In the specification, a region where the center portion of the pixel electrode 35 and the functional layer 36 are connected to each other through the opening 36H is referred to as a pixel opening portion.

On the insulation layer 34, the functional layer 36 including an organic luminescence layer is formed by a vapor stack method. The functional layer 36 in the embodiment includes a hole injection layer, a hole transportation layer, an organic luminescence layer, an electron transportation layer, and an electron injection layer. However, other layers in addition to these layers may be provided, and any of the hole injection layer, the hole transportation layer, the electron transportation layer, and the electron injection layer may or may not be provided. In addition, a plurality of these layers may be integrally formed.

The functional layer 36 in the embodiment, when a current flows between the pixel electrode 35 and the opposite electrode 37, includes a red luminescence layer where red light is emitted, a green luminescence layer where green light is emitted, and a blue luminescence layer where blue light is emitted. Accordingly, light which includes red light, green light, and blue light is emitted from the functional layer 36, and light which is visible as a whole as white is emitted. The functional layer 36 is commonly formed in a plurality of luminescence elements 12B, 12G, and 12R, and is designed to have a film thickness of about 100 nm to 200 nm.

The functional layer 36 may be changed to the red luminescence layer, the green luminescence layer, and the blue luminescence layer, and include the blue luminescence layer and a yellow luminescence layer. It is possible to obtain pseudo-white light according to such a combination.

The opposite electrode 37 is formed on the functional layer 36. The opposite electrode 37 in the embodiment functions as a cathode, and is also a semi-transmission reflection layer which forms a resonator structure in a space between the functional layer 36 and the reflection layer 32 described above. The opposite electrode 37 is forced over a plurality of luminescence elements 12 (12B, 12G, and 12R), transmits a portion of the light emitted from the organic luminescence layer, and reflects the portion to the reflection layer 32 side. The opposite electrode 37 may be formed by evaporating a metal made of Ag or Al and the alloy thereof (for example, MgAg) or by stacking a layer made of different materials in a thin manner.

A protection layer 38 for protecting the functional layer 36 and the opposite electrode 37 from moisture and oxygen is provided on the opposite electrode 37. For example, the protection layer 38 is made of, for example, an oxide or a nitride of inorganic materials such as silicon and Al (aluminum), or an oxynitride. In addition, the protection layer 38 can be made of these inorganic materials and organic materials (preferably organic material having a low gas transmittance) in a stack structure. The protection layer 38 functions as a planarization layer so that unevenness of the surface of the opposite electrode 37 may not affect a color filter 40 formed later by being connected to the protection layer 38.

The color filter 40 includes each colored layer 41B, 41G, and 41R of colors corresponding to each sub-pixel 11B, 11G, and 11R, and these colored layers 41B, 41G, and 41R are formed on the same layer. The colored layer 41B, 41G, and 41R can foe formed by a photolithographic method by applying a photosensitive resin material including a dye and a pigment as a coloring material to the protection layer 38.

As the coloring material, a pigment having an excellent light resistance is preferably used rather than a dye, and metal organic compounds such as metal complexes and the like are used as the pigment, for example. In addition, a binder holding these coloring materials includes an acrylic resin, an epoxy resin, and the like.

A blue colored layer of 41B as a first colored layer overlaps the first portion 51 and the second portion 52 of the pixel electrode 35B in a plan view. A green colored layer 41G as a second colored layer overlaps the third portion 53 and the fourth portion 54 of the pixel electrode 35G in a plan view. A red colored layer of 41R as a third colored layer overlaps the fifth portion 55 and the sixth portion 56 of the pixel electrode 35R in a plan view.

The blue colored layer 41B allows most of the blue light to be transmitted through and absorbs some. Accordingly, light emitted from the blue luminescence element 12B and enhanced by the optical resonator passes through the blue colored layer 41B, thereby increasing the color purity of blue. The green colored layer 41G allows most of the green light to be transmitted through and absorbs some. Accordingly, light emitted from the green luminescence element 12G and enhanced by the optical resonator passes through the green colored layer 41G, thereby increasing the color purity of green. The red colored layer 41R allows most of the red light to be transmitted through and absorbs some. Accordingly, light emitted from the red luminescence element 12R and enhanced by the optical resonator passes through the red colored layer 41R, thereby increasing the color purity of red.

Incidentally, the functional layer 36 releases light from not only a portion (region) overlapping the center portion (the first portion 51, the third portion 53, and the fifth portion 55) of the sub-pixel 11, but also a portion (region) overlapping the peripheral portion (the second portion 52, the fourth portion 54, and the sixth portion 56) or the sub-pixel 11. In the step portion in the peripheral portion of the pixel electrode 35, the functional layer 36 is not able to form a film with a uniform thickness and is thinner than other portions (a portion (region) overlapping the center portion). It is considered that it is because a carrier (hole and electron) injected from the pixel electrode 35 and the opposite electrode 37 spreads not only in a stack direction of the functional layer 36, but also in a horizontal direction (a direction substantially in parallel with the first surface 1A of the substrate 1) through a portion, where the functional layer 36 becomes thinner.

An optical distance $D_1$ of the optical resonator in the center portion of the pixel electrode 35 (an optical distance $D_{B1}$ of the optical resonator in the first portion 51, an optical distance $D_{G1}$ of the optical resonator in the third portion 53, and an optical distance $D_{R1}$ of the optical resonator in the fifth portion 55) are provided so that light having a desired peak wavelength $\lambda_1$ (a peak wavelength of blue light $\lambda_{B1}$, a peak wavelength of green light $\lambda_{G1}$, and a peak wavelength of red light $\lambda_{R1}$) resonates. In contrast, an optical distance $D_2$ of the optical resonator in the peripheral portion of the pixel electrode 35 (an optical distance $D_{B2}$ of the optical resonator in the second portion 52, an optical distance $D_{G2}$ of the optical resonator in the fourth portion 54, and an optical distance $D_{R2}$ of the optical resonator in the sixth portion 56) is greater than the optical, distance $D_1$ by an amount of a product of a film thickness of the insulation layer 34 and a refractive index thereof.

Therefore, light, which has a luminescence peak wavelength $\lambda_2$ shifted to a wavelength longer than $\lambda_1$ by $\Delta\lambda$, is extracted from a portion (region) overlapping the peripheral portion. More specifically, in a portion (region) overlapping the second portion 52, light, which has a peak wavelength of $\lambda_{B2}$ shifted to a wavelength side longer than $\lambda_{B1}$ by $\Delta\lambda$, is visible, light which has a peak wavelength of $\lambda_{G2}$ shifted to a wavelength side longer than $\lambda_{G1}$ by $\Delta\lambda$ is visible in a portion (region) overlapping the fourth portion 54, and in a portion (region) overlapping the sixth portion 56, light, which has a peak wavelength of $\lambda_{G2}$ shifted to a wavelength side longer than $\lambda_{G1}$ by $\Delta\lambda$, is visible. In the specification, light having a peak wavelength of $\lambda_2$ ($\lambda_{B2}$, $\lambda_{G2}$, and $\lambda_{R2}$) is also referred to as abnormal luminescence.

When the abnormal luminescence is mixed in light emitted from the luminescence element 12 (12B, 12G, and 12R), a color deviation occurs and thereby it is not possible to perform a display using a desired chromaticity. Even if the color filter 40 is provided, light absorption characteristics of the general color filter 40 are broad. Therefore, there is a risk that the color deviation cannot be removed without sufficiently cutting light having the peak wavelength of $\lambda_2$ when $\lambda_2$ is in a range of transmission wavelength of the color filter 40.

Therefore, in the organic EL device 100 of the embodiment, by adjusting the film thickness of the insulation layer 34, the peak wavelength $\lambda_2$ of light emitted from the peripheral portion of the sub-pixel 11 (pixel electrode 35) is shifted to a range where the color filter 40 can be absorbed.

A relation between transmission characteristics of light of the color filter 40 and the film thickness of the insulation layer 34 will be described using FIGS. 4A to 9C.

Figure 4A:
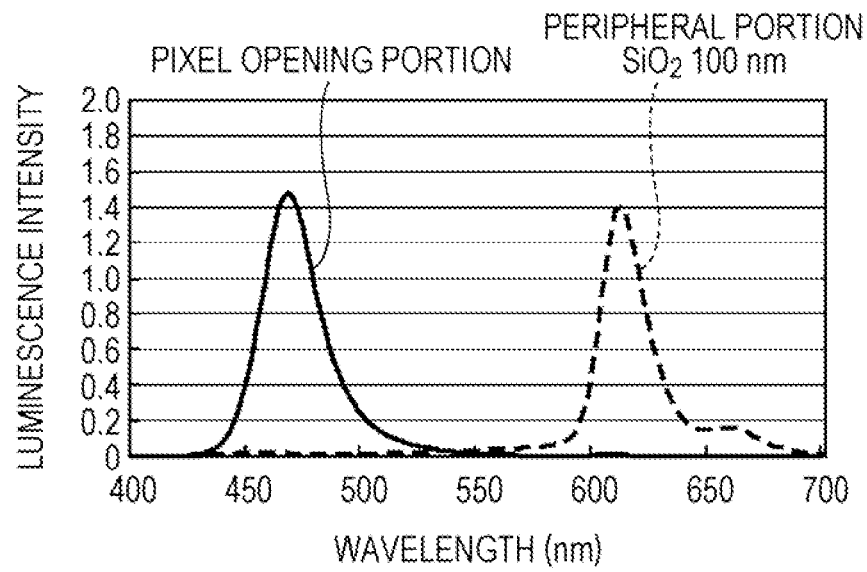
FIGS. 4A to 4D are graphs each showing spectral characteristics of a blue luminescence element and transmission characteristics of light of a color filter according to the first embodiment.
Figure 4B:
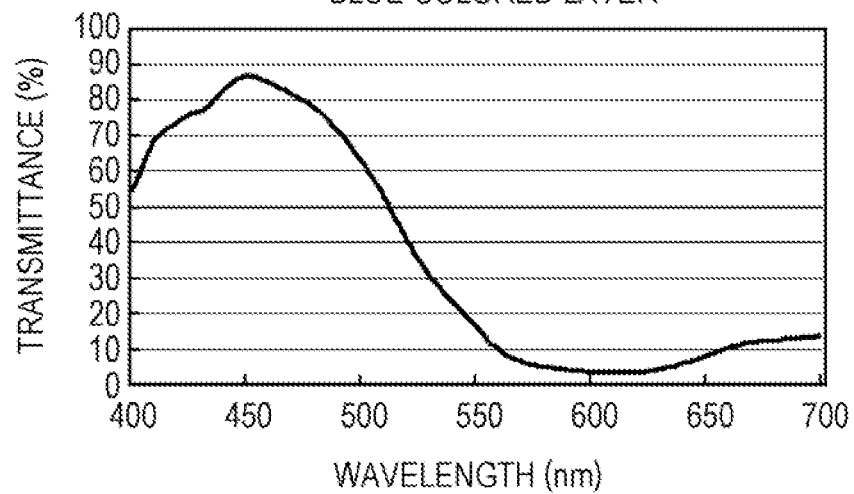
Figure 4C:
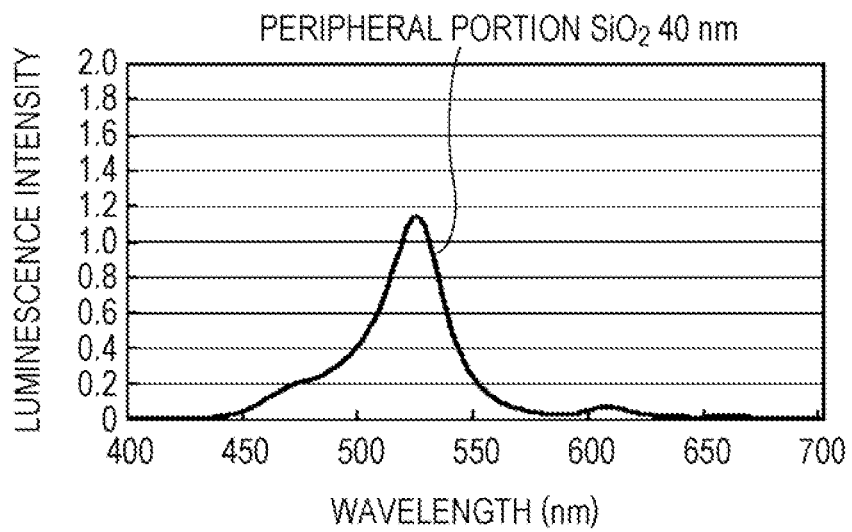
Figure 4D:
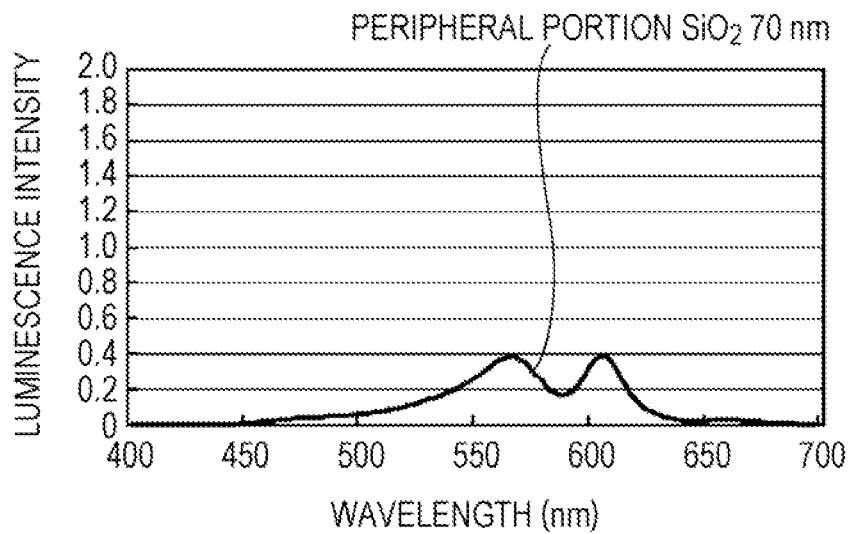

FIGS. 4A to 4D are graphs each showing spectral characteristics of a blue luminescence element according to the embodiment 1 and transmission characteristics of light of the color filter. More specifically, FIG. 4A is a graph showing spectral characteristics of light emitted from the blue luminescence element, FIG. 4B is a graph showing transmission characteristics of light of the blue colored layer, and FIGS. 4C and 4D are graphs showing spectral characteristics of light emitted from the second portion (peripheral portion) at a time of changing the film thickness of the insulation layer.

Figure 5A:
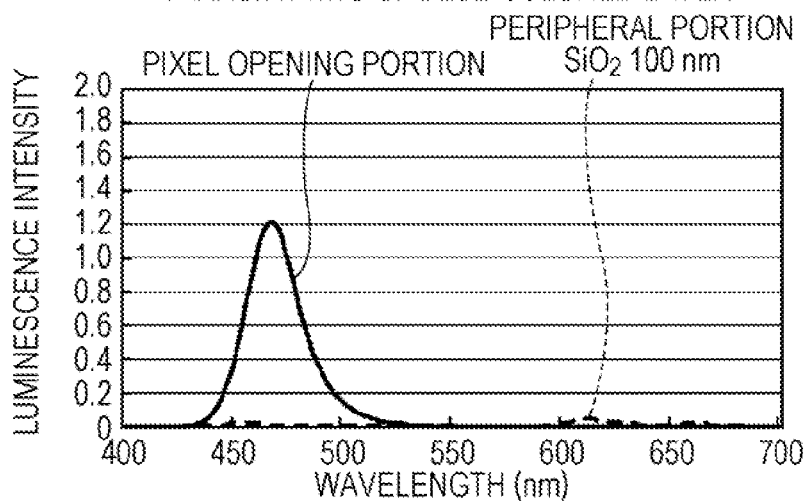
FIG. 5A is a graph combining spectral characteristics of a blue luminescence element with transmission characteristics of a blue colored layer.
Figure 5B:
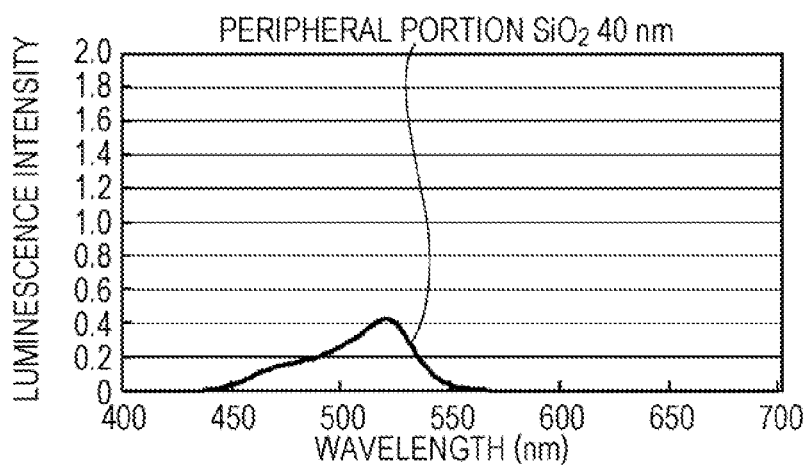
FIGS. 5B and 5C are graphs combining the spectral characteristics of the blue luminescence element and the transmission characteristics of the blue colored layer in a second portion at a time of changing the film thickness of an insulation layer.
Figure 5C:
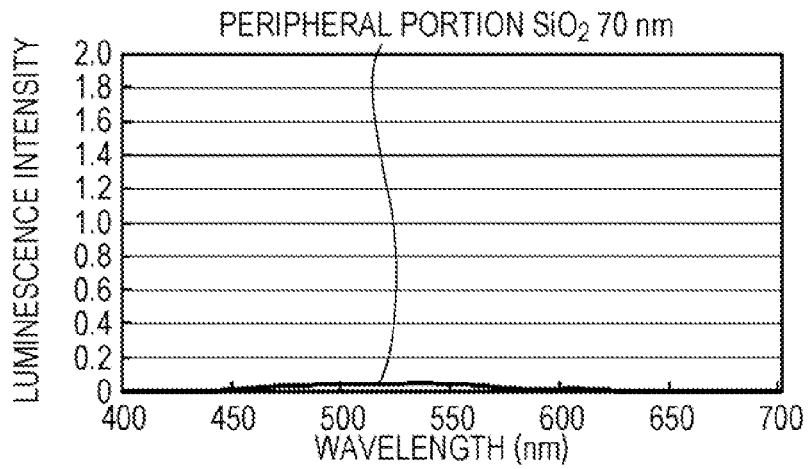

FIG. 5A is a graph combining spectral characteristics of a blue luminescence element with transmission characteristics of a blue colored layer, and FIGS. 5B and 5C are graphs combining the spectral characteristics of the blue luminescence element and the transmission characteristics of the blue colored layer in a second portion (peripheral portion) at the time of changing the film thickness of the insulation layer.

Figure 6A:
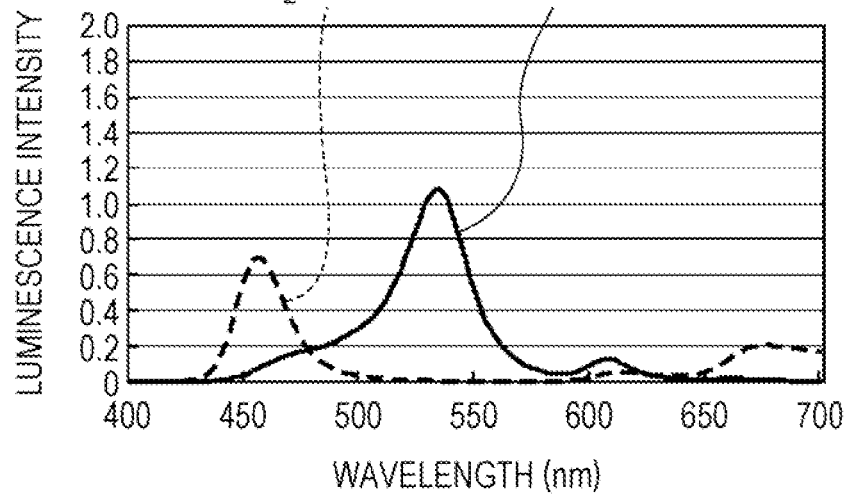
FIGS. 6A to 6B are graphs each showing spectral characteristics of a green luminescence element and transmission characteristics of light of a color filter according to the first embodiment.
Figure 6B:
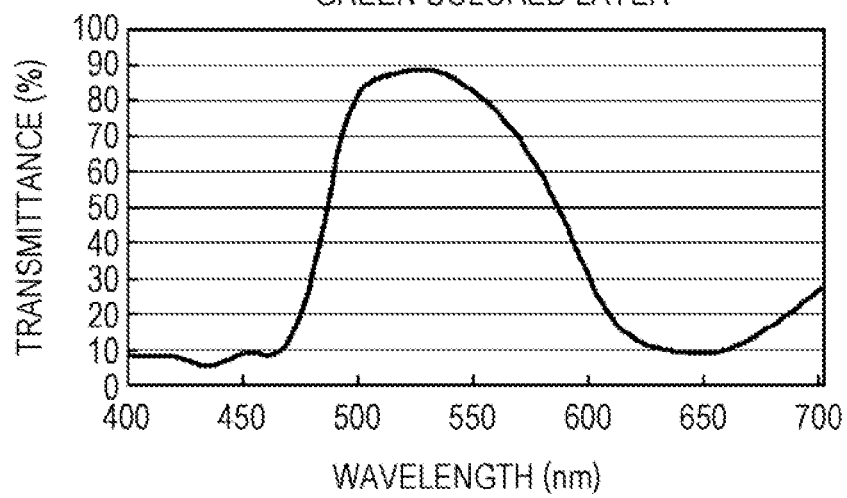
Figure 6C:
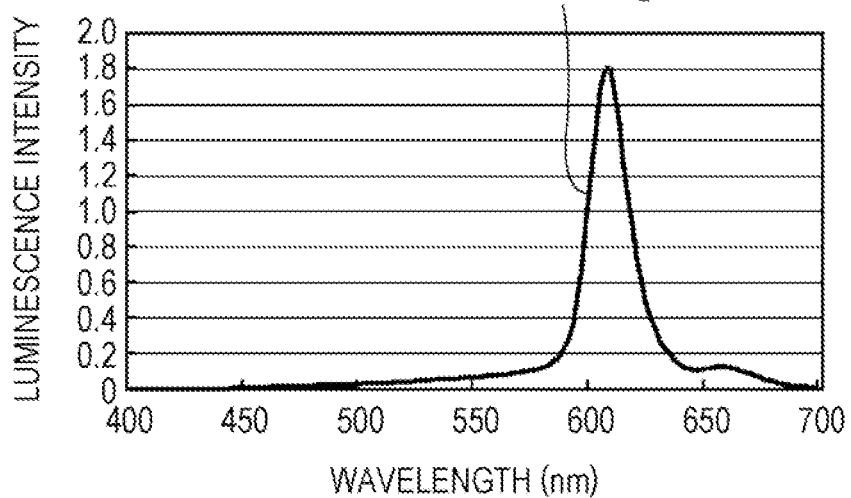
Figure 6D:
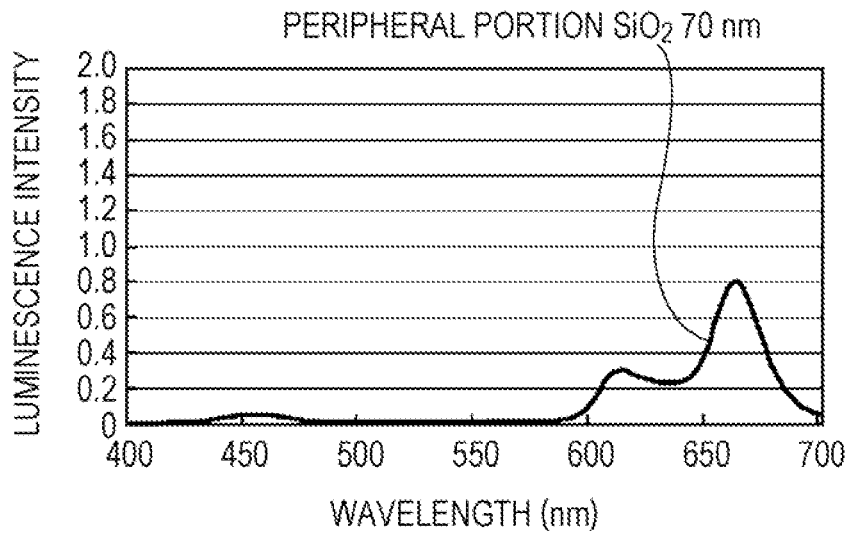

FIGS. 6A to 6D are graphs showing spectral characteristics of the green luminescence element and transmission characteristics of light of the color filter according to embodiment 1. More specifically, FIG. 6A is a graph showing spectral characteristics of light emitted from the green luminescence element, FIG. 6B is a graph showing transmission characteristics of light of the green colored layer, and FIGS. 6C and 6D are graphs showing spectral characteristics of light emitted from the fourth portion (peripheral portion) at the time of changing the film thickness of the insulation layer.

Figure 7A:
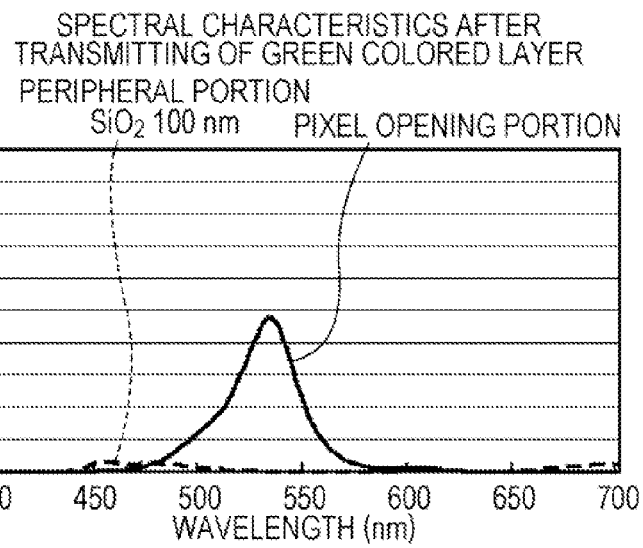
FIG. 7A is a graph combining the spectral characteristics of the green luminescence element with the transmission characteristics of a green colored layer.
Figure 7B:
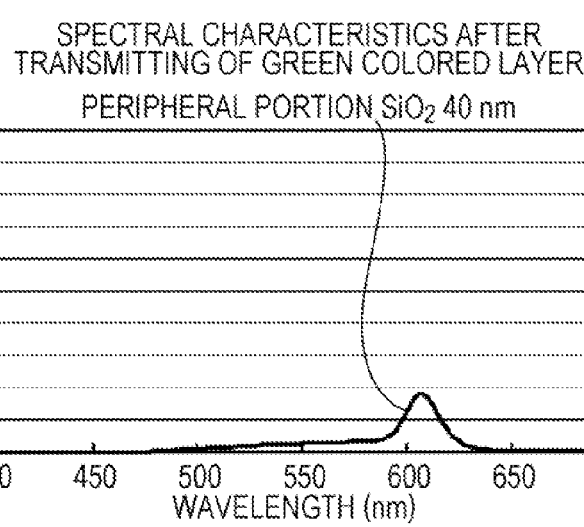
FIGS. 7B and 7C are graphs each combining the spectral characteristics of the green luminescence element with the transmission characteristics of the green colored layer in a fourth portion at the time of changing the film thickness of the insulation layer.
Figure 7C:
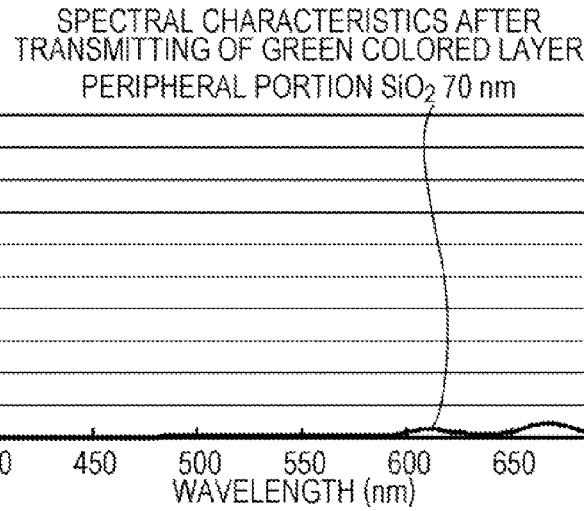

FIG. 7A is a graph combining the spectral characteristics of the green luminescence element and the transmission characteristics of the green colored layer, and FIGS. 7B and 7C are graphs combining the spectral characteristics of the green luminescence element and the transmission characteristics of the green colored layer in the fourth portion (peripheral portion) at the time when changing the film thickness of the insulation layer.

Figure 8A:
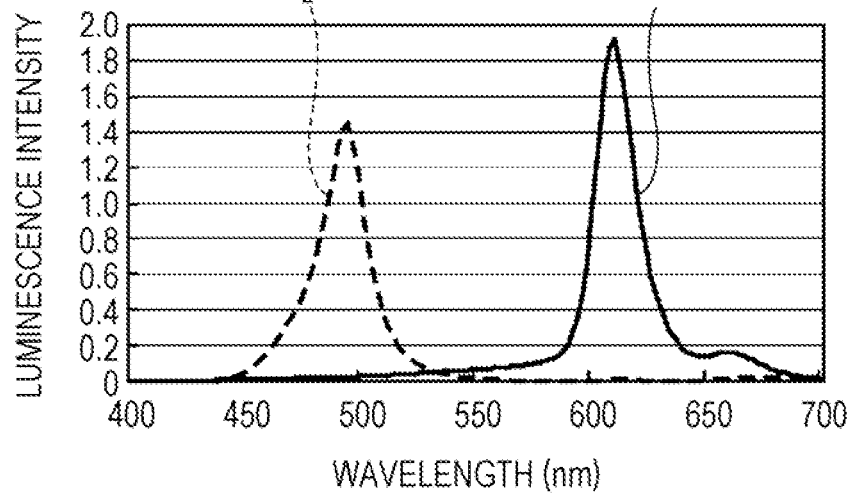
FIGS. 8A to 8D are graphs each showing spectral characteristics of a red luminescence element and transmission characteristics of light of a color filter according to the first embodiment.
Figure 8B:
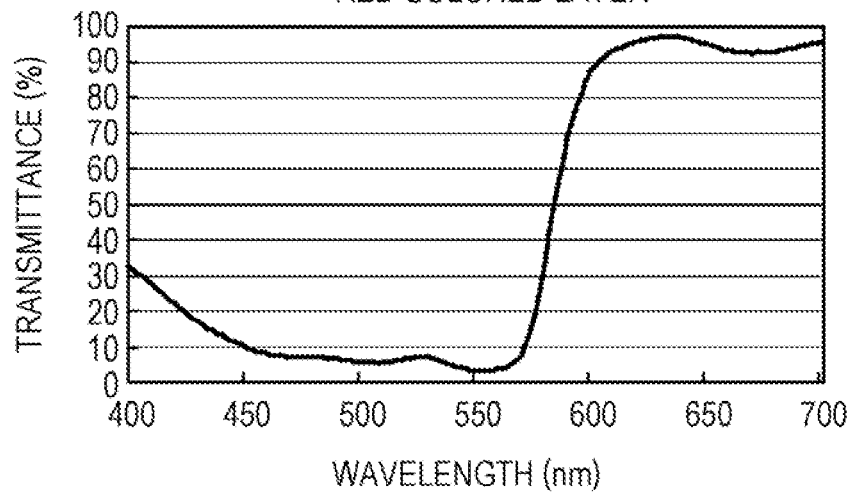
Figure 8C:
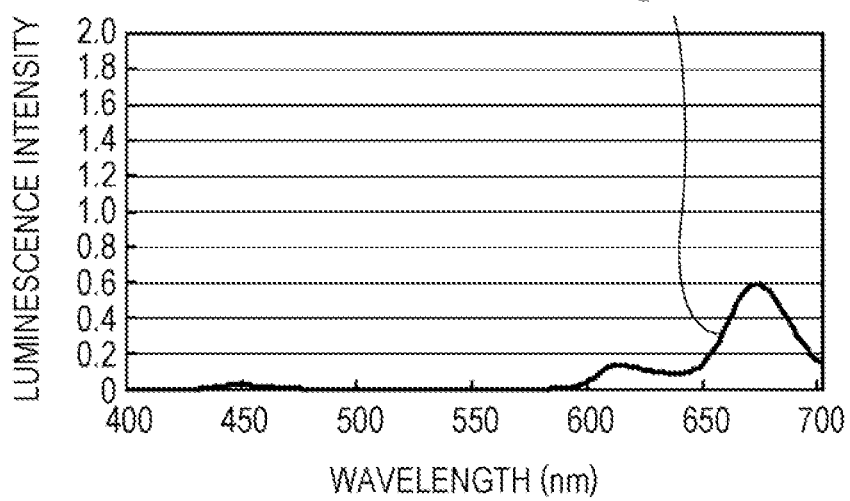
Figure 8D:
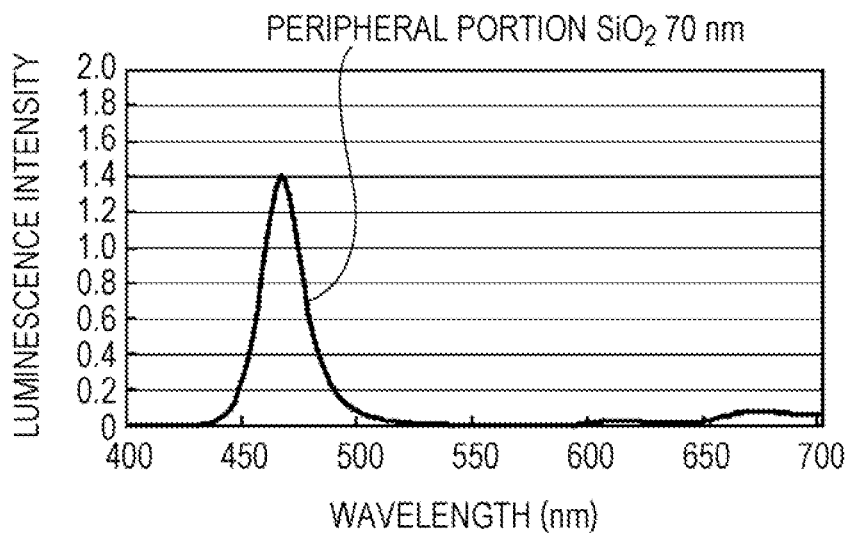

FIGS. 8A to 8D are graphs showing the spectral characteristics of the red luminescence element and the transmission characteristics of light of the color filter according to embodiment 1. More specifically, FIG. 8A is a graph showing the spectral characteristics of light emitted from the red luminescence element, FIG. 8B is a graph showing the transmission characteristics of light of the red colored layer, and FIGS. 8C and 8D are graphs showing the spectral characteristics of light emitted from the sixth portion (peripheral portion) at the time of changing the film thickness of the insulation layer.

Figure 9A:
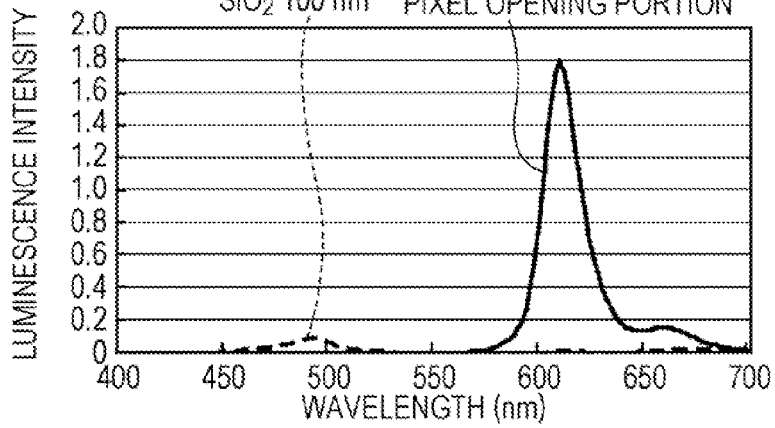
FIG. 9A is a graph combining the spectral characteristics of the red luminescence element with transmission characteristics of a red colored layer.
Figure 9B:
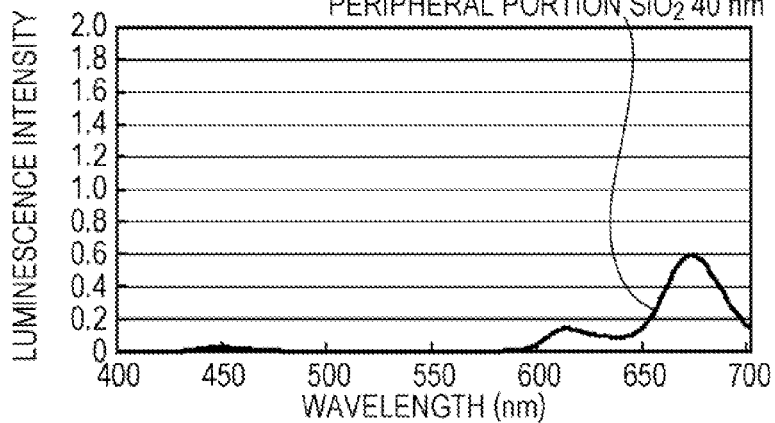
FIGS. 9B and 9C are graphs each combining the spectral characteristics of the red luminescence element with the transmission characteristics of the red colored layer in a sixth portion at the time of changing the film thickness of the insulation layer.
Figure 9C:
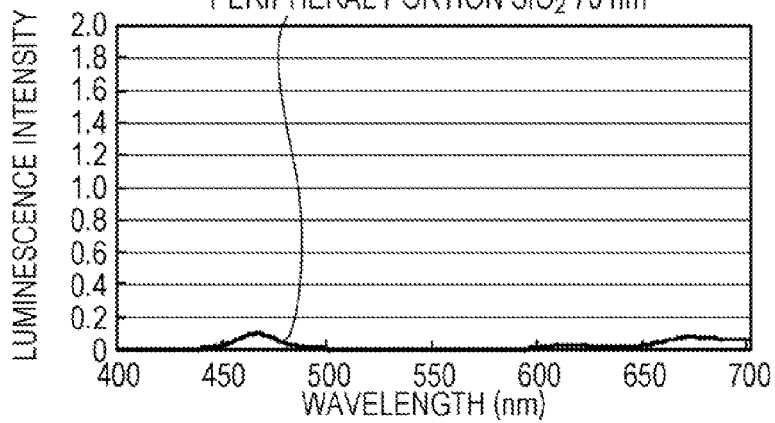

FIG. 9A is a graph combining the spectral characteristics of the red luminescence element and the transmission characteristics of the red colored layer, and FIGS. 9B and 9C are graphs combining the spectral characteristics of the red luminescence element and the transmission characteristics of the red colored layer in the sixth portion (peripheral portion) at the time of changing the film thickness of the insulation layer.

A horizontal axis in FIGS. 4A to 9C are a wavelength of light. The vertical axis of the graph showing the spectral characteristics of a luminescence element is luminescence intensity, and the vertical axis of the graph showing the transmission characteristics of light of the colored layers 41B, 41G, and 41R is transmittance.

In FIG. 4A, a graph indicated by a solid line is about the spectral characteristics of light emitted from a region (pixel opening portion) overlapping the center portion (the first portion 51) of the pixel electrode 35B, and is designed so that the peak wavelength of light enhanced by the optical resonator is 460 nm. A graph indicated by one-dot dashed lines shows the spectral characteristics of light emitted from the peripheral portion (the second portion 52) of the pixel electrode 35B when forming the insulation layer 34 at a thickness of 100 nm using $SiO_2$ whose refractive index is 1.4. A graph indicated in FIG. 4C shows the spectral characteristics of light emitted from a region overlapping the peripheral portion (the second portion 52) of the pixel electrode 35B when forming the insulation layer 34 at a thickness of 40 nm using $SiO_2$ whose refractive index is 1.4. A graph indicated in FIG. 4D shows the spectral characteristics of light emitted from the peripheral portion (the second portion 52) of the pixel electrode 35B when forming the insulation layer 34 at a thickness of 70 nm using $SiO_2$ whose refractive index is 1.4.

A graph in FIG. 4B snows the transmission characteristics of light of the blue colored layer 41B when forming a resin which is a coloring material of blue and includes Pigment No. BLUE 15:6 at a film thickness of 1.5 μm.

In FIG. 6A, a graph indicated by a solid line is about the spectral characteristics of light emitted from a region (pixel opening portion) overlapping the center portion (the third portion 53) of the pixel electrode 35G, and is designed so that the peak wavelength of light enhanced by the optical resonator is 540 nm. A graph indicated by a one-dot dashed line shows the spectral characteristics of light emitted from the peripheral portion (the fourth portion 54) of the pixel electrode 35G when forming the insulation layer 34 at a thickness of 100 nm using $SiO_2$ whose refractive index is 1.4. A graph indicated in FIG. 6C shows the spectral characteristics of light emitted from a region overlapping the peripheral portion (the fourth portion 54) of the pixel electrode 35G when forming the insulation layer 34 at a thickness of 40 nm using $SiO_2$ whose refractive index is 1.4. A graph indicated in FIG. 6D shows the spectral characteristics of light emitted from a region overlapping the peripheral portion (the fourth portion 54) of the pixel electrode 35G when forming the insulation layer 34 at a thickness of 70 nm using $SiO_2$ whose refractive index is 1.4.

A graph in FIG. 6B shows the transmission characteristics of light of the green colored layer 41G when forming a resin which includes Pigment No. GREEN 36 at a film thickness of 1.5 μm.

In FIG. 8A, a graph indicated by a solid line is about the spectral characteristics of light emitted from a region (pixel opening portion) overlapping the center portion (the fifth portion 55) of the pixel electrode 35R, and a graph indicated by a one-dot dashed line shows the spectral characteristics of light emitted from the peripheral portion (the sixth portion 56) of the pixel electrode 35R when forming the insulation layer 34 at a thickness of 100 nm using $SiO_2$ whose refractive index is 1.4. The peak wavelength of light enhanced by the optical resonator is designed to be 610 nm. A graph indicated in FIG. 8C shows the spectral characteristics of light emitted from a region overlapping the peripheral portion (the sixth portion 56) of the pixel electrode 35R when forming the insulation layer 34 at a thickness of 40 nm using $SiO_2$ whose refractive index is 1.4. A graph indicated in FIG. 8D shows the spectral characteristics of light emitted from a region overlapping the peripheral portion (the sixth portion 56) of the pixel electrode 35R when forming the insulation layer 34 at a thickness of 70 nm using $SiO_2$ whose refractive index is 1.4.

A graph of FIG. 8B shows the transmission characteristics of light of the red colored layer 41R when forming a resin which includes Pigment No. RED 254 at a film thickness of 1.5 μm.

As seen from FIGS. 4A, 4B, and 5A, the first light emitted from a region (pixel opening portion) overlapping the first portion 51 of the luminescence element 12B has the peak wavelength $\lambda_{B1}$ which is in a range (transmittance is equal to or more than 80%) where transmittance of the colored layer 41B is high, and most of the first light is transmitted through the colored layer 41B.

Then, in the organic EL device 100 of the invention, the film thickness of the insulation layer 34 is adjusted so that the second light emitted from a region (peripheral portion) overlapping the second portion 52 has a peak wavelength $\lambda_{B2}$ in a range where transmittance of the colored layer 41B is lower than transmittance of the wavelength $\lambda_{B1}$. For example, when the film thickness of the insulation layer 34 is formed at a thickness of 100 nm or 70 nm, transmittance of the second light in the colored layer 41B is equal to or less than 10% (refer to FIGS. 5A and 5C).

Accordingly, the second light which is emitted from a region (peripheral portion) overlapping the second portion 52 of the functional layer 36 and resonated by the optical resonator structure is absorbed into the blue colored layer 41B at a higher rate than the first light which is emitted from a region (pixel opening portion) overlapping the first portion 51 of the functional layer 36 and resonated by the optical resonator structure.

Therefore, compared to an organic EL device in which the film thickness of the insulation layer 34 is not adjusted, it is possible to reduce a rate of abnormal luminescence mixed in light emitted from the luminescence element 12B, and to provide the organic EL device 100 in which the color deviation is suppressed and which has an excellent display quality.

On the other hand, when the film thickness of the insulation layer 34 is not adjusted so that the peak wavelength $\lambda_{B2}$ is in a range where transmittance of the colored layer 41B is lower than transmittance of the wavelength $\lambda_{B1}$, for example, when the film thickness of the insulation layer 34 is formed at a film thickness of 40 nm, the peak wavelength of the second light is about 530 nm as shown in FIG. 4C. Since the transmittance of the colored layer 41B of the second light whose peak wavelength is 530 nm is equal to or more than 15%, most of the abnormal luminescence can be transmitted through the colored layer 41B and the color deviation cannot be prevented (refer to FIG. 5B).

As seen from FIGS. 6A, 6B, and 7A, the third light emitted from a region (pixel opening portion) overlapping the third portion 53 of the luminescence element 12G has a peak wavelength $\lambda_{G1}$ which is in a range (transmittance is equal to or more than 60%) where transmittance of the colored layer 41G is high, and most of the third light is transmitted through the colored layer 41G.

The film thickness of the insulation layer 34 is adjusted so that a fourth light emitted from a region (peripheral portion) overlapping the fourth portion 54 of the luminescence element 12G has a peak wavelength $\lambda_{G2}$ in a range where transmittance of the colored layer 41G is lower than transmittance of a wavelength $\lambda_{G1}$. For example, when the film thickness of the insulation layer 34 is formed at a thickness of 100 nm or 70 nm, transmittance of the fourth light of the colored layer 41G is equal to or less than 10% (refer to FIGS. 7A and 7C).

Therefore, the fourth light which is emitted from a region (peripheral portion) overlapping the fourth portion 54 of the luminescence element 12G and resonates due to the optical resonator structure is absorbed into the green colored layer 41G at a higher rate than the third light which is emitted from a region (pixel opening portion) overlapping the third portion 53 of the luminescence element 12G and is resonated by the optical resonator structure.

Therefore, compared to the organic EL device in which the film thickness of the insulation layer 34 is not adjusted, it is possible to reduce the rate of abnormal luminescence mixed in light emitted from the luminescence element 12G, and to provide the organic EL device 100 in which the color deviation is suppressed and which has an excellent display quality.

On the other hand, when the film thickness of the insulation layer 34 is not adjusted so that a peak wavelength $\lambda_{G2}$ is in a range where transmittance of the colored layer 41G is lower than transmittance of a wavelength $\lambda_{G1}$, for example, when the film thickness of the insulation layer 34 is formed at 40 nm, the peak wavelength of the fourth light is about 610 nm as shown in FIG. 6C. Since the transmittance of the colored layer 41G of the fourth light whose peak wavelength is 610 nm is equal to or more than 15%, most of the abnormal luminescence can be transmitted through the colored layer 41G, and the color deviation cannot be prevented (FIG. 7B).

As seen from FIGS. 8A, 8B, and 9A, the fifth light emitted from a region (pixel opening portion) overlapping the fifth portion 55 of the luminescence element 12R has a peak wavelength $\lambda_{R1}$ in a range (transmittance is equal to or more than 80%) where transmittance of the colored layer 41R is high, and most of the fifth light is transmitted through the colored layer 41R.

The film thickness of the insulation layer 34 is adjusted so that the sixth light emitted from a region (peripheral portion) overlapping the sixth portion 56 of the luminescence element 12R has a peak wavelength $\lambda_{R2}$ in a range where transmittance of the colored layer 41R is lower than transmittance of a wavelength $\lambda_{R1}$. For example, when the film thickness of the insulation layer 34 is formed at a thickness of 100 nm or 70 nm, transmittance of the sixth light of the colored layer 41R is equal to or less than 10% (refer to FIGS. 9A and 9C).

Accordingly, the sixth light which is emitted from a region (peripheral portion) overlapping the sixth portion 56 of the luminescence element 12R and is resonated by the optical resonator structure is absorbed into the red colored layer 41R at a higher rate than the fifth light which is emitted from a region (pixel opening portion) overlapping the fifth portion 55 of the luminescence element 12R and is resonated by the optical resonator structure.

Therefore, compared to the organic EL device in which the film thickness of the insulation layer 34 is not adjusted, it is possible to reduce the rate of abnormal luminescence mixed in light emitted from the luminescence element 12R and to provide the organic EL device 100 in which the color deviation is suppressed and which has an excellent display quality.

On the other hand, when the film thickness of the insulation layer 34 is not adjusted so that a peak wavelength $\lambda_{R2}$ is in a range where the transmittance of the colored layer 41R is lower than the transmittance of the wavelength $\lambda_{R1}$, for example, when the film thickness is formed at a film thickness of 40 nm, the peak waive length of the sixth light is about 450 nm and 680 nm as shown in FIG. 8C. Since transmittance of the colored layer 41R of the sixth light whose peak wavelength is about 450 nm and 680 nm is equal to or more than 15%, most of the abnormal luminescence can be transmitted through the colored layer 41R and the color deviation cannot be prevented (refer to FIG. 9B).

When the blue colored layer 41B has a rate of transmitting light of a peak wavelength of $\lambda_{B2}$ lower than a rate of transmitting light of a peak wavelength of $\lambda_{B1}$, the effect of the invention is obtained. However, it is preferable to adjust the film thickness of the insulation layer 34 so as to shift the $\lambda_{B2}$ to a range where the transmittance of the second light of the blue colored layer 41B is equal to less than 15%, and is more preferable to adjust the film thickness of the insulation layer 34 so as to shift the $\lambda_{B2}$ to a range where the transmittance is equal to or less than 10%. As a result, it is possible to provide the organic EL device 100 which has less color deviation and has an excellent display quality.

When the green colored layer 41G has a rate of transmitting light of a peak wavelength of $\lambda_{G2}$ lower than a rate of transmitting light of a peak wavelength of $\lambda_{G1}$, the effect of the invention is obtained. However, it is preferable to adjust the film thickness of the insulation layer 34 so as to shift the $\lambda_{G2}$ to a range where the transmittance of the fourth light of the green colored layer 41G is equal to or less than 15%, and is more preferable to adjust the film thickness of the insulation layer 34 so as to shift the $\lambda_{G2}$ to a range where the transmittance is equal to or less than 10%. As a result, it is possible to provide the organic EL device 100 which has less color deviation and has an excellent display quality.

When the red colored layer 41R has a rate of transmitting light of a peak wavelength of $\lambda_{R2}$ lower than a rate of transmitting light of a peak wavelength of $\lambda_{R1}$, the effect of the invention is obtained. However, it is preferable to adjust the film thickness of the insulation layer 34 so as to shift the $\lambda_{R2}$ to a range where the transmittance of the sixth light of the red colored layer 41R is equal to or less than 15%, and is more preferable to adjust the film thickness of the insulation layer 34 so as to shift the $\lambda_{R2}$ to a range where the transmittance is equal to or less than 10%. As a result, it is possible to provide the organic EL device 100 which has less color deviation and has an excellent display quality.

In sub-pixels of all colors 11B, 11G, and 11R, when the film thickness of the insulation layer 34 is adjusted so that transmittance such that light having a peak wavelength of $\lambda_2$ is transmitted through a corresponding colored layer 41 is equal to or less than 15%, it is possible to set a sRGB cover rate to 80% or more, and to produce the organic EL device 100 which has a good color reproducibility.

When the insulation layer 34 is made of $SiO_2$ at a film thickness of 70 nm as described above, the $\lambda_2$ is in this range and the sRGB cover rate is 87%. In addition, when the insulation layer 34 is made of $SiO_2$ at a film thickness of 100 nm, the $\lambda_2$ is in this range (sRGB cover rate is equal to or more than 80%) and the sRGB cover rate is 90%.

On the other hand, in the sub-pixels of all colors 11B, 11G, and 11R, when the film thickness of the insulation layer 34 is not adjusted so that transmittance such that light having the peak wavelength of $\lambda_2$ is transmitted through the corresponding colored layer 41 is equal to or less than 15%, for example, when transmittance such that the light having the peak wavelength of $\lambda_2$ is transmitted through the corresponding colored layer 41 is 20%, the sRGB cover rate is 74% and the color reproducibility is poor.

When the insulation layer 34 is made of $SiO_2$ at a film thickness of 40 nm, the $\lambda_2$ cannot be in this range (the sRGB cover rate is equal to or more than 80%), and the sRGB cover rate is 75%.

Then, among the film thicknesses at which the $\lambda_2$ can be shifted to a range where transmittance of the second light, the fourth light, and the sixth light of the colored layer 41 is equal to or less than 15%, a film thickness which is common for a blue sub-pixel 11B, a green sub-pixel 11G, and a red sub-pixel 11R is selected as the film thickness of the insulation layer 34, and thereby it is possible to manufacture the organic EL device 100 of the embodiment in a simple process.

When the film thickness of the insulation layer 34 is more than 150 nm, there is a possibility that the functional layer 36 and the opposite electrode 37 can be disconnected on the step of the insulation layer 34 and the pixel electrode 35. Therefore, it is preferable that the film thickness of the insulation layer 34 be less than 150 nm.

The invention is particularly effective in an organic EL device having a small pixel size. When an area of the pixel electrode 35 is relatively large, for example, when the long side of the pixel electrode 35 is about 100 μm, even if the abnormal luminescence occurs in a portion (region) overlapping the peripheral portion of the pixel electrode 35, a rate of the pixel electrode 35 occupying in the entire light emitted from the luminescence element 12 is small. Therefore, it is difficult to recognize the color deviation. However, when the area of the pixel electrode 35 is small, for example, when the long side of the pixel electrode 35 is reduced to about 10 μm, a rate of abnormal luminescence occupying in light emitted from, the luminescence element 12 is relatively large, and the color deviation in the peripheral portion of the sub-pixel 11 is significantly visible.

For example, in the pixel electrode 35 whose long side is 100 μm and whose short side is 50 μm, when the insulation layer 34 covers a range from the outer edge to 0.5 μm inside the pixel electrode 35, an area where the abnormal luminescence is visible is merely about 3% of the entire pixel electrode 35. On the other hand, in the pixel electrode 35 whose long side is 10 μm and whose short side is 5 μm, when the insulation layer 34 covers a range from the outer edge to 0.5 μm inside the pixel electrode 35, a rate of an area where the abnormal luminescence is visible is 28%, and when the long side of the pixel electrode 35 is 5 μm and the short side thereof is 2.5 μm, the rate is 48%. The invention is particularly effective in an organic EL device in which the long side of the pixel electrode 35 is equal to or less than 10 μm, and more particularly effective in an organic EL device in which the long side of the pixel electrode 35 is equal to or less than 5 μm.

As described above, according to the embodiment, it is possible to provide the organic EL device 100 which has less color deviation and an excellent display quality.

The invention is not limited to the embodiment described above, and can be appropriately changed in a range which is not contrary to the spirit or the concepts of the invention read from the claims and the entire specification. An organic electroluminescence device according to the changes is also included in a technical range of the invention. In addition to the embodiment described above, various modification examples are considered. Hereinafter, a description will be given referring to a modification example.

First Modification Example

In the embodiment 1 described above, film thicknesses of the insulation layer 34 disposed in each of the blue sub-pixel 11B, the green sub-pixel 11G, and the red sub-pixel 11R is the same as each other. However, film thicknesses of the insulation layer 34 disposed in each sub-pixel 11B, 11G, and 11R may be different from each other, film thicknesses of the insulation layer 34 disposed in two sub-pixels among these sub-pixels 11B, 11G, and 11R may be the same as each other, and a film thickness of the insulation layer 34 disposed in the remaining one sub-pixel may be different from film thicknesses of the insulation layer 34 disposed in the other two sub-pixels. Specifically, film thicknesses of the insulation layer 34 disposed in the blue sub-pixel 11B and the green sub-pixel 11G may be the same as each other, and film thicknesses of the insulation layer 34 disposed in the blue sub-pixel 11B and the red sub-pixel 11R may be the same as each other. Film thicknesses of the insulation layer 34 disposed in the green sub-pixel 11G and the red sub-pixel 11R may be the same as each other.

Accordingly, it is possible to adjust the film thickness of the insulation layer 34 disposed in each sub-pixel 11B, 11G, and 11R at an optimum film thickness according to transmittance of the colored layers 41B, 41G, and 41R.

Second Modification Example

In addition, in the embodiment 1 described above, the film thickness of the insulation layer 34 is adjusted in all the sub-pixels 11 of blue (B), green (G), and red (R). However, the insulation layer 34 in one type or two types of sub-pixel 11 may have the film thickness which is not adjusted.

In general, it is known that a green light is easily visible to human eyes, and it is unlikely to sense the color deviation which occurs even if the abnormal luminescence is mixed in light emitted from the luminescence element 12G. In this case, even if the film thickness of the insulation layer 34 disposed in the green sub-pixel 11G is not adjusted, it is possible to provide the organic EL device 100 which has an excellent display quality.

Similarly, when the color deviation is unlikely to be visible even if the abnormal luminescence is mixed in light emitted from the blue luminescence element 12B, the film thickness of the insulation layer 34 disposed in the blue sub-pixel 11B may or may not be adjusted, and when the color deviation is unlikely to be visible even if the abnormal luminescence is mixed in light emitted from the red luminescence element 12R, the film thickness of the insulation layer 34 disposed in the red sub-pixel 11R may or may not be adjusted.

Third Modification Example

A method of setting transmittance of the second light, the fourth light, and the sixth light on the colored layer 41 to 15% or less is not limited to a method of adjusting the film thickness of the insulation layer 34. For example, the transmission characteristics of light on the colored layer 41 may be adjusted. In addition, an adjustment of the film thickness of the insulation layer 34 and an adjustment of the transmission characteristics of light of the colored layer 41 may be combined. A method of adjusting the transmission characteristics of light of the colored layer 41 includes selection of a coloring material and a binder, adjustment of contents, adjustment of a film thickness of the colored layer 41, and the like.

Second Embodiment

Electronic Apparatus

Figure 10:
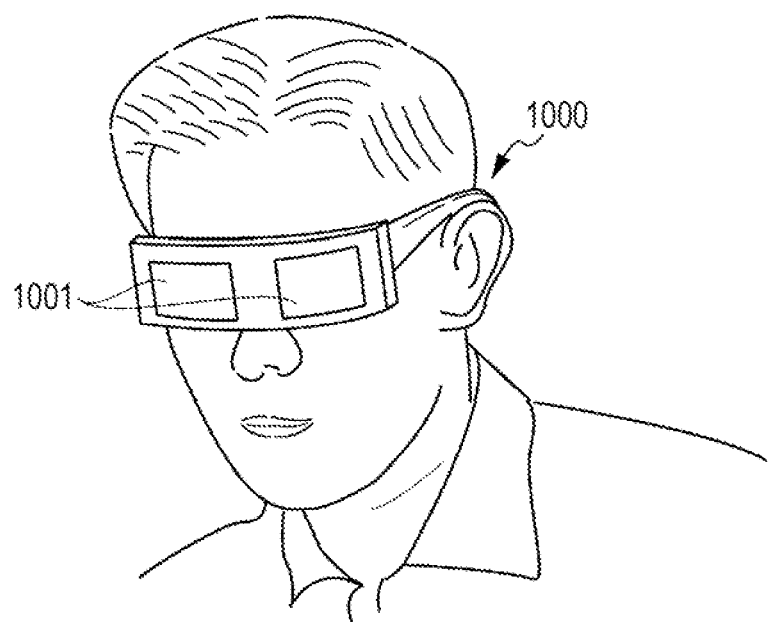
FIG. 10 is a schematic perspective view showing a head-mounted display as an electronic apparatus.

Next, an electronic apparatus of the embodiment will be described referring to FIG. 10. FIG. 10 is a schematic perspective view showing a head-mounted display as an electronic apparatus.

As shown in FIG. 10, a head-mounted display 1000 as the electronic apparatus of the embodiment has two display units 1001 provided corresponding to right and left eyes. By mounting the head mounted display 1000 onto a head like glasses, a viewer can see characters and images displayed on the display unit 1001. For example, if an image is displayed considering a disparity on the left and the right of the display unit 1001, it is possible to enjoy a three-dimensional image.

The display unit 1001 is equipped with the organic EL device 100 described above. Therefore, it is possible to provide the head-mounted display 1000 which has less color deviation and has an excellent display quality.

The head-mounted display 1000 is not limited to have two display units 1001, but may be configured to have one display unit 1001 corresponding to either of the left or the right.

The electronic apparatus equipped with the organic EL device 100 described above is not limited to the head-mounted display 1000. For example, the electronic apparatus is an electronic apparatus having a display unit such as a head-up display, a personal computer and a portable information terminal, a navigator, a viewer, and the like.

The entire disclosure of Japanese Patent Application No. 2012-274431, filed Dec. 17, 2012 is expressly incorporated by reference herein.

What is claimed is:

1. An organic electroluminescence device comprising:
   a substrate;
   a first colored layer disposed above a first surface of the substrate;
   a first luminescence element which is disposed between the first surface of the substrate and the first colored layer, and has a stack structure where a first pixel electrode, a functional layer including a luminescence layer, and an opposite electrode are stacked;
   a first reflection layer which is disposed between the first surface and the first pixel electrode, and forms a first resonator structure between the first reflection layer and the opposite electrode; and
   an insulation layer disposed between the first surface and the functional layer through the first pixel electrode,
   wherein the first pixel electrode includes a first portion which does not overlap the insulation layer and a second portion which overlaps the insulation layer in a plan view,
   wherein light emitted from the first luminescence element includes a first light, which is emitted from a portion which overlaps the first portion of the functional layer and has a first peak wavelength, and a second light, which is emitted from a portion which overlaps the second portion of the functional layer and has a second peak wavelength, and
   wherein a film thickness of the insulation layer or optical characteristics of the first colored layer are set so that the first light is transmitted through the first colored layer more than the second light is.

2. The organic electroluminescence device according to claim 1,
   wherein transmittance of the second light in the first colored layer is equal to or less than 15%.

3. An electronic apparatus comprising the organic electroluminescence device according to claim 2.

4. The organic electroluminescence device according to claim 1,
   wherein the film thickness of the isolation layer is set so that transmittance of the second light in the first colored layer is equal to or less than 15%.

5. An electronic apparatus comprising the organic electroluminescence device according to claim 4.

6. The organic electroluminescence device according to claim 1, further comprising:
   a second colored layer which has different transmission characteristics of light from the first colored layer;
   a second luminescence element which is disposed between the first surface and the second colored layer, and has a stack structure in which a second pixel electrode, the functional layer, and the opposite electrode are stacked; and
   a second reflection layer which is disposed between the first surface and the second pixel electrode, and forms a second resonator structure between the second reflection layer and the opposite electrode,
   wherein the second pixel electrode includes a third portion which does not overlap the insulation layer and a fourth portion which overlaps the insulation layer,
   wherein light emitted from the second luminescence element includes a third light, which is emitted from a portion overlapping the third portion of the functional layer and has a third peak wavelength, and a fourth light which is emitted from a portion overlapping the fourth portion of the functional layer and has a fourth peak wavelength,
   wherein the second colored layer absorbs the fourth light more than the third light, and
   wherein the film thickness of the insulation layer overlapping the second portion is different from the film thickness of the insulation layer overlapping the fourth portion.

7. An electronic apparatus comprising the organic electroluminescence device according to claim 6.

8. The organic electroluminescence device according to claim 1, further comprising:
   a third colored layer which has different transmission characteristics of light from the first colored layer;
   a third luminescence element which is disposed between the first surface and the third colored layer and has a stack structure in which a third pixel electrode, the functional layer, and the opposite electrode are stacked; and
   a third reflection layer which is disposed between the first surface and the third pixel electrode and forms a third resonator structure between the third reflection layer and the opposite electrode,
   wherein the third pixel electrode includes a fifth portion which does not overlap the insulation layer and a sixth portion which overlaps the insulation layer,
   wherein light released from the third luminescence element includes a fifth light, which is emitted from a portion overlapping the fifth portion of the functional layer and has a fifth peak wavelength, and a sixth light, which is emitted from a portion overlapping the sixth portion of the functional layer and has a sixth peak wavelength, and
   wherein the third colored layer transmits 15% or more of the fifth light and the sixth light.

9. An electronic apparatus comprising the organic electroluminescence device according to claim 8.

10. An electronic apparatus comprising the organic electroluminescence device according to claim 1.

11. An organic electroluminescence device comprising:
    a substrate;
    a first colored layer which is disposed on a first surface of the substrate;
    a first luminescence element which is disposed between the first surface of the substrate and the first colored layer, and has a stack structure in which a first pixel electrode, a functional layer including a luminescence layer, and an opposite electrode are stacked,
    a first reflection layer which is disposed between the first surface and the first pixel electrode, and forms a first resonator structure between the first reflection layer and the opposite electrode; and an insulation layer which is disposed between the first surface and the functional layer through the first pixel electrode, wherein the first pixel electrode includes a first portion which does not overlap the insulation layer, and a second portion which overlaps the insulation layer in a plan view, wherein light released from the first luminescence element includes a first light, which is emitted from a portion overlapping the first portion of the functional layer and has a first peak wavelength, and a second light, which is emitted from a portion overlapping the second portion of the functional layer and has a second peak wavelength, and wherein a film thickness of the insulation layer or optical characteristics of the first colored layer are set so that transmittance of light of the first colored layer in the first peak wavelength is higher than transmittance of light of the first colored layer in the second peak wavelength.

12. An electronic apparatus comprising the organic electroluminescence device according to claim 11.

* * * * *